United States Patent
Subramonium et al.

(10) Patent No.: US 7,981,777 B1
(45) Date of Patent: Jul. 19, 2011

(54) METHODS OF DEPOSITING STABLE AND HERMETIC ASHABLE HARDMASK FILMS

(75) Inventors: Pramod Subramonium, Salem, OR (US); Yongsik Yu, Lake Oswego, OR (US); Zhiyuan Fang, West Linn, OR (US); Jon Henri, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 248 days.

(21) Appl. No.: 11/710,377

(22) Filed: Feb. 22, 2007

(51) Int. Cl.
*H01L 21/00* (2006.01)
(52) U.S. Cl. ........................................ 438/485
(58) Field of Classification Search .............. 430/322, 430/311, 323; 438/780, 758, 485, 478, 680; 428/408
See application file for complete search history.

(56) References Cited

U.S. PATENT DOCUMENTS

| | | | |
|---|---|---|---|
| 4,668,261 A | 5/1987 | Chatzipetros et al. | |
| 4,863,493 A | 9/1989 | Kotani et al. | |
| 4,863,760 A * | 9/1989 | Schantz et al. | 427/163.2 |
| 5,231,057 A | 7/1993 | Doki et al. | |
| 5,261,250 A | 11/1993 | Missimer | |
| 5,378,316 A | 1/1995 | Franke et al. | |
| 5,470,661 A | 11/1995 | Bailey et al. | |
| 6,030,591 A | 2/2000 | Tom et al. | |
| 6,035,803 A | 3/2000 | Robles et al. | |
| 6,066,209 A | 5/2000 | Sajoto et al. | |
| 6,150,719 A | 11/2000 | Saia et al. | |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,541,397 B1 | 4/2003 | Bencher | |
| 6,573,030 B1 * | 6/2003 | Fairbairn et al. | 430/323 |
| 6,617,553 B2 | 9/2003 | Ho et al. | |
| 6,967,072 B2 | 11/2005 | Latchford et al. | |
| 7,223,526 B2 | 5/2007 | Fairbairn et al. | |
| 7,314,506 B2 | 1/2008 | Vininski et al. | |
| 7,323,401 B2 | 1/2008 | Ramaswamy et al. | |
| 7,371,461 B2 | 5/2008 | Fuller et al. | |
| 7,381,644 B1 | 6/2008 | Subramonium et al. | |
| 2001/0021491 A1 | 9/2001 | Chen et al. | |
| 2002/0182848 A1 | 12/2002 | Joseph et al. | |

(Continued)

FOREIGN PATENT DOCUMENTS

WO WO 2005/048367 * 11/2004

OTHER PUBLICATIONS

U.S. Office Action mailed Dec. 14, 2006, from U.S. Appl. No. 11/318,269.

(Continued)

*Primary Examiner* — Thomas L Dickey
*Assistant Examiner* — Nikolay Yushin
(74) *Attorney, Agent, or Firm* — Weaver Austin Villeneuve & Sampson LLP (57) ABSTRACT

The present invention provides PECVD methods for forming stable and hermetic ashable hard masks (AHMs). The methods involve depositing AHMs using dilute hydrocarbon precursor gas flows and/or high LFRF/HFRF ratios. In certain embodiments, the AHMs are transparent and have high etch selectivities. Single and dual layer hermetic AHM stacks are also provided. According to various embodiments, the dual layer stack includes an underlying AHM layer having tunable optical properties and a hermetic cap layer.

16 Claims, 6 Drawing Sheets

U.S. PATENT DOCUMENTS

| | | | |
|---|---|---|---|
| 2003/0044532 | A1 | 3/2003 | Lee et al. |
| 2004/0016972 | A1 | 1/2004 | Singh et al. |
| 2004/0018750 | A1 | 1/2004 | Sophie et al. |
| 2004/0023502 | A1 | 2/2004 | Tzou et al. |
| 2004/0140506 | A1 | 7/2004 | Singh et al. |
| 2004/0180551 | A1 | 9/2004 | Biles et al. |
| 2004/0224504 | A1 | 11/2004 | Gadgil |
| 2004/0266195 | A1 | 12/2004 | Dokumaci et al. |
| 2005/0042889 | A1 | 2/2005 | Lee et al. |
| 2005/0098119 | A1 | 5/2005 | Burger et al. |
| 2005/0112506 | A1* | 5/2005 | Czech et al. ............... 430/322 |
| 2006/0091559 | A1* | 5/2006 | Nguyen et al. ............... 257/775 |
| 2006/0154086 | A1 | 7/2006 | Fuller et al. |
| 2006/0197881 | A1 | 9/2006 | Kang et al. |
| 2006/0205223 | A1 | 9/2006 | Smayling |
| 2007/0048674 | A1 | 3/2007 | Wells |
| 2007/0059913 | A1 | 3/2007 | King et al. |
| 2007/0125762 | A1 | 6/2007 | Cui et al. |
| 2007/0128538 | A1 | 6/2007 | Fairbairn et al. |
| 2007/0166546 | A1 | 7/2007 | Ichikawa et al. |
| 2007/0166979 | A1 | 7/2007 | Wang et al. |
| 2007/0247073 | A1* | 10/2007 | Paterson et al. .......... 315/111.21 |
| 2008/0128907 | A1 | 6/2008 | Yang et al. |
| 2008/0242912 | A1 | 10/2008 | Letessier et al. |
| 2008/0254641 | A1 | 10/2008 | Kobayashi et al. |
| 2009/0182180 | A1 | 7/2009 | Huang et al. |

OTHER PUBLICATIONS

Subramonium et al., "Pulsed PECVD Method for Modulating Hydrogen Content in Hard Mask", U.S. Appl. No. 11/318,269, filed Dec. 23, 2005.

Ikeda et al., "Top-PECVD": A New Conformal Plasma Enhanced CVD Technology using TEOS, Ozone and Pulse-modulated RF Plasma, 1992 IEEE, pp. 11.2.1-11.2.4.

Subramonium et al., "Methods of Depositing Highly Selective Transparent Ashable Hardmask Films," Novellus Systems, Inc., U.S. Appl. No. 11/449,983, filed Jun. 8, 2006, pp. 1-21.

Fang et al., "Methods of Improving Ashable Hardmask Adhesion to Metal layers," Novellus Systems, Inc., U.S. Appl. No. 11/612,382, filed Dec. 18, 2006.

U.S. Office Action mailed Oct. 9, 2007, from U.S. Appl. No. 11/612,382.

Grill, et al. "Diamondlike carbon films by rf plasma-assisted chemical vapor deposition from acetylene," IBM J. Res. Develop., vol. 34, No. 6, Nov. 1990, pp. 849-857.

Callegari et al., "Optical properties of hydrogenated amorphous-carbon film for attenuated phase-shift mask applications," J.Vac. Sci. Technol. B 11(6), Nov./Dec. 1993, pp. 2697-2699.

Grill, A., "Diamond-like carbon: state of the art," Diamond and Related Mateials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

U.S. Office Action mailed Dec. 27, 2007, from U.S. Appl. No. 11/449,983.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods and Apparatus for Plasma-Based Deposition," Novellus Systems, Inc., U.S. Appl. No. 11/849,208, filed Aug. 31, 2007.

Notice of Allowance and Fee Due mailed May 7, 2007 from U.S. Appl. No. 11/318,269.

Allowed Claims from U.S. Appl. No. 11/318,269.

U.S. Office Action mailed Jul. 9, 2008, from U.S. Appl. No. 11/449,983.

U.S. Final Office Action mailed May 13, 2008, from U.S. Appl. No. 11/612,382.

U.S. Office Action mailed Aug. 19, 2008, from U.S. Appl. No. 11/612,382.

Subramonium et al., "Methods of Depositing Smooth and Conformal Ashable Hard Mask Films," Novellus Systems, Inc., U.S. Appl. No. 12/163,670, filed Jun. 27, 2008.

Hsu et al., "Method for Purifying Acetylene Gas for Use In Semiconductor Processes," Novellus Systems, Inc., U.S. Appl. No. 12/133,223, filed Jun. 4, 2008.

U.S. Office Action mailed Jan. 5, 2009, from U.S. Appl. No. 11/449,983.

Henri, et al., Method for Improved Thickness Repeatability of PECVD Deposited Carbon Films, Novellus Systems, Inc., U.S. Appl. No. 12/334,220, filed Dec. 12, 2008.

U.S. Office Action mailed Feb. 24, 2009, from U.S. Appl. No. 11/612,382.

U.S. Appl. No. 11/612,382, Office Action mailed Feb. 24, 2009.

U.S. Appl. No. 11/612,382, Final Office Action mailed May 12, 2009.

U.S. Appl. No. 12/133,223, Office Action mailed Aug. 19, 2009.

U.S. Appl. No. 11/449,983, Office Action mailed Sep. 15, 2009.

U.S. Appl. No. 11/710,652, Office Action mailed Nov. 20, 2009.

U.S. Appl. No. 11/612,382, Office Action mailed Dec. 9, 2009.

U.S. Appl. No. 12/133,223, Office Action mailed Dec. 21, 2009.

U.S. Appl. No. 12/133,223, Notice of Allowance mailed Mar. 2, 2010.

U.S. Appl. No. 12/133,223, Allowed Claims.

U.S. Appl. No. 11/612,382, Office Action mailed Mar. 26, 2010.

U.S. Appl. No. 12/766,721, "Methods For Forming Conductive Carbon Films By PECVD", Fox et al., filed Apr. 23, 2010.

U.S. Appl. No. 12/786,842, "Method for purifying acetylene gas for use in semiconductor processes", Hsu et al., filed May 25, 2010.

U.S. Appl. No. 11/449,983, Office Action mailed Jun. 21, 2010.

Korean Office Action mailed Jun. 1, 2010 for Application No. 2009-0048358.

* cited by examiner

METHODS OF DEPOSITING STABLE AND HERMETIC ASHABLE HARDMASK FILMS

FIELD OF THE INVENTION

This invention relates to a novel method of producing ashable hard masks in semiconductor processing.

BACKGROUND OF THE INVENTION

Ashable hard masks (AHMs) are films used in semiconductor processing that may be removed by a technique referred to as "ashing." In particular, AHMs are often used as etch stop layers. 193 nm or lower lithography schemes require these AHMs to have high etch selectivity to underlying dielectric or metal barrier layers. In addition, 193 nm lithography schemes employ a 633 nm mask alignment laser—requiring the AHM to be transparent to light at 633 nm.

To date, know methods of producing highly selective AHMs rely on relatively high temperature (greater than 500 C) PECVD deposition processes. Many PECVD reactors are not designed to withstand such high processing temperatures, however. In addition, the extinction coefficient ("k value") of these films is typically higher than ideal for 193 nm lithography schemes. Processes for producing transparent films with a lower carbon content typically have low etch selectivity and are unstable. Further, they are non-hermetic, allowing moisture to penetrate the film prior to deposition of the overlying layer.

SUMMARY OF THE INVENTION

The present invention provides PECVD methods for forming stable and hermetic ashable hard masks (AHMs). The methods involve depositing AHMs using dilute hydrocarbon precursor gas flows and/or high LFRF/HFRF ratios. In certain embodiments, the AHMs are transparent and have high etch selectivities. Single and dual layer hermetic AHM stacks are also provided. According to various embodiments, the dual layer stack includes an underlying AHM layer having tunable optical properties and a hermetic cap layer.

One aspect of the invention relates to a method of depositing an AHM involving providing a semiconductor device substrate in a deposition chamber, exposing the substrate to a process gas comprising a hydrocarbon precursor gas having a partial pressure between about 0.01 and 4 torr and depositing on the substrate a substantially hermetic ashable hard mask by a plasma enhanced chemical vapor deposition (PECVD) process using a dual frequency RF (LF and HF) plasma power source wherein the LF/HF ratio is high.

According to various embodiments, the LF/HF ratio ranges from about 2:1 to 50:1. In particular embodiments, the hydrocarbon precursor partial pressure ranges from about 0.01-1 torr, e.g., 0.01-0.2 torr. In particular embodiments, process temperatures between about 30 and 500 C, e.g., between about 30 and 300 C, are used.

Another aspect of the invention relates to depositing a multi-layer AHM on the substrate. The method involves providing a semiconductor device substrate in a deposition chamber, depositing a first ashable hard mask on the substrate, and depositing an ashable hard mask cap layer on the first ashable hard mask, wherein ashable hard mask cap layer is substantially hermetic.

According to various embodiments, depositing the ashable hard mask cap layer comprises a plasma enhanced chemical vapor deposition (PECVD) process using a dual frequency RF (LF and HF) power in which the LF:HF ratio is at least about 2:1, or in certain embodiments, at least about 3:1, 5:1 or 10:1.

The methods of the invention may also involve depositing additional layers on the hermetic AHMs, e.g., for subsequent photolithographic processing. In certain embodiments, anti-reflective layers and/or photoresist layers are deposited on the AHMs. In a particular embodiment, a photoresist layer is deposited directly on a hermetic AHM capping layer (i.e., without an intervening ARL).

In certain embodiments, the resulting hardmasks (e.g., the single layer hermetic AHM or the bottom layer of the dual layer hermetic AHM) have low extinction coefficients, for example less than about 0.1. In some embodiments, the extinction coefficients are less than about 0.05. The hardmask are also highly selective, having selectivities of at least about 12:1, or at least about 15:1 according to various embodiments. Carbon content typically ranges between about 50-70%. In certain embodiments, the AHMs deposited by the methods of the invention are suitable for use as etch stops. In addition, the AHMs are suitable for use with 193 nm and below lithography schemes.

BRIEF DESCRIPTION OF THE DRAWINGS

FIGS. 6A and 6B show FTIR spectra of various AHMs. FIG. 6A shows the $CH_x$ stretching vibration at around 2800-3100 $cm^{-1}$ and FIG. 6B shows a C=C and two $CH_x$ bending peaks at around 1600, 1450 & 1350 $cm^{-1}$, respectively.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

INTRODUCTION

Hard masks are used as etch stop layers in semiconductor processing. Ashable hard masks (AHMs) have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). The bonding structure in these hard masks can vary from SP2 (graphite-like) to SP3 (diamond-like) or a combination of both, depending on the deposition conditions. In a typical application, after etching the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hermeticity refers to the ability of the AHM to prevent air and moisture penetration. Hermetic can protect the underlying layers, such as layers of metal and dielectric, from exposure to atmospheric moisture and oxygen, thereby preventing undesirable oxidation of metal surfaces and absorption of moisture by a dielectric. In certain embodiments, the hermetic films described herein substantially prevent penetration of any or all of ambient atmospheric components including moisture, oxygen, carbon dioxide and nitrogen. In particular embodiments, the hermetic films act as barriers to at least to atmospheric moisture and/or oxygen.

Current methods to deposit AHMs result in non-hermetic films, which can lead to moisture penetrating into an AHM during long queue times between AHM and anti-reflective layer (ARL) deposition. Moisture can lead to difficulties during integration, including film blistering during subsequent ARL deposition. One method of dealing with moisture penetration is an anneal step to desorb moisture prior to the ARL deposition; however this operation increases processing costs and fabrication time.

The methods of the invention relate to depositing stable and hermetic AHMs. In certain embodiments, the methods of the invention are used to deposit a single or dual layer AHMs. The single layer AHMs of the invention are hermetic and stable. According to various embodiments, the dual layer AHMs have a top cap layer that is hermetic and a bottom layer that may or may not be hermetic. In certain embodiments, the top layer has fixed optical properties while the bottom layer has tunable optical properties.

In certain embodiments, the methods of the invention provide hermetic AHMs that are used in 193 nm or lower lithography schemes. 193 nm lithography requires AHMs to have high etch selectivity to underlying dielectric or metal barrier layers. In addition, 193 nm lithography schemes employ a 633 nm mask alignment laser—requiring the AHM to be transparent to light at 633 nm. According to various embodiments, the films are stable, hermetic, highly selective and transparent at 633 nm.

In certain embodiments, the methods of the invention involve depositing dense carbon films with high SP3 content while maintaining a carbon percentage of around 60% (e.g., between about 50-70%). At typical PECVD operating regimes, the carbon films are dominated by SP2 bonding (e.g., SP3:SP2 ratio of around 1:3.5). In certain embodiments, the methods of the invention increase SP3 content, e.g. so that SP3:SP2 is around 1:1, by depositing films at low temperature and low hydrocarbon precursor partial pressure. The films may be densified to reduce the void fraction, e.g., by high energy bombardment. The application of low frequency radio frequency (LFRF) during PECVD deposition is used in certain embodiments to supply the high energy ion bombardment. As the films are densified, they become stable, hermetic and highly selective. In addition, maintaining high SP3 content makes the film transparent at 633 nm.

PECVD Deposition

Figure 1:
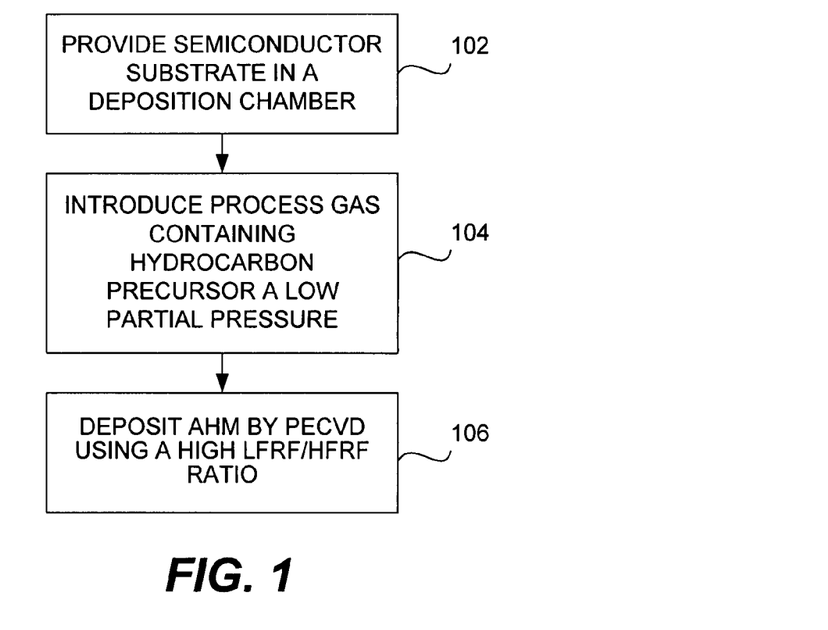
FIGS. 1 and 2 depict important stages in general process flows for methods of forming ashable hard masks in accordance with the present invention.

FIG. 1 depicts important stages in a general process flow for a method of forming a hermetic ashable hard mask in accordance with the present invention. The method begins by providing a semiconductor device substrate in a deposition chamber (102). A process gas comprising a hydrocarbon precursor gas is introduced to the chamber (104). In certain embodiments, the hydrocarbon precursor is introduced at low partial pressure, e.g. between about 0.01-4 torr. In certain embodiments, the partial pressure is at or below about 0.2 torr.

The hydrocarbon precursor may be, for example, one defined by the formula $C_XH_Y$, wherein X=2 to 10 and Y=2-24. Specific examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Acetylene is a preferred precursor in many applications.

A carrier gas may be used to dilute the precursor flow. The carrier gas may be any suitable carrier gas, including helium, argon, nitrogen, hydrogen, or a combination of any of these.

Flow rates depend on the particular deposition chamber and substrate; examples of flow rates used for 300 mm substrates are between 200-4000 sccm $C_2H_2$; 1000-20000 sccm $H_2$; and 1000-20000 sccm He. In particular embodiments, the flowrates ranges from 200-2000 sccm $C_2H_2$; 6000-12000 sccm $H_2$; and 1000-12000 sccm He.

An ashable hard mask is deposited on the substrate by a PECVD process (106). As indicated above, in certain embodiments, the methods of the invention use LFRF power to generate high energy ion bombardment. Low frequency RF power refers to RF power having a frequency between 100 kHz and 2 MHz and typically 350-450 kHz. During deposition of the hermetic AHMs, LF power typically ranges from about 0.001-0.05 $W/cm^2$, in particular embodiments, from about 0.02-0.05 $W/cm^2$. HF power typically ranges from 0.001-0.02 $W/cm^2$ and in particular embodiments, from 0.02-0.05 $W/cm^2$. In certain embodiments, the high energy ion bombardment is supplied by setting the LF/HF ratio, e.g., ranging from about 2:1-50:1, in a particular embodiment 10:1. The invention is not limited to RF plasma sources, but may use any suitable plasma source with high energy ion bombardment generated by using low precursor partial pressure and/or appropriately controlling the plasma generation.

Process (substrate) temperature is preferably below 500 C. In some embodiments, the process temperature is below about 400 C, for example, between about 30 and 400 C. In some embodiments, the process temperature is below about 30° C., for example between about 30 and 300 C. In particular embodiments, the process temperature is between about 50 and 250 C, e.g, between 150 and 250 C.

Operation 106 is continued until the desired thickness of film is deposited. According to various embodiments, between about 1000 and 9000 angstroms is deposited. As discussed below, in certain embodiments, a thin AHM layer (e.g., between about 50 to several hundred angstroms thick) may be deposited as a hermetic cap layer.

Chamber pressure may be any suitable pressure. In conventional AHM deposition processes, pressure is typically 5-10 torr. In particular embodiments of the present invention, the total chamber pressure may be lower than conventionally used. For example, it may range from 1-2 torr.

As is discussed further below, the use of both low hydrocarbon precursor partial pressure and high LF power facilitates the deposition of hermetic films. Also in certain embodiments, the films are selective and transparent at 633 nm. According to various embodiments, the methods of the present invention produce AHMs having etch selectivity of between about 15:1-20:1 relative to underlying dielectric and metal barrier layers. Also according to various embodiments, the highly selective AHMs are transparent at 633 nm. In certain embodiments, the AHMs have extinction coefficients less than or equal to about 0.1 at 633 nm. Acceptable k values may depend on AHM film thickness, with thicker films requiring lower extinction coefficients. In a particular embodiment, an AHM of 5000 angstroms having a k of no more than about 0.1 is deposited. In another embodiment, an AHM of 9000 angstroms having a k of no more than about 0.05 is deposited.

Figure 2:
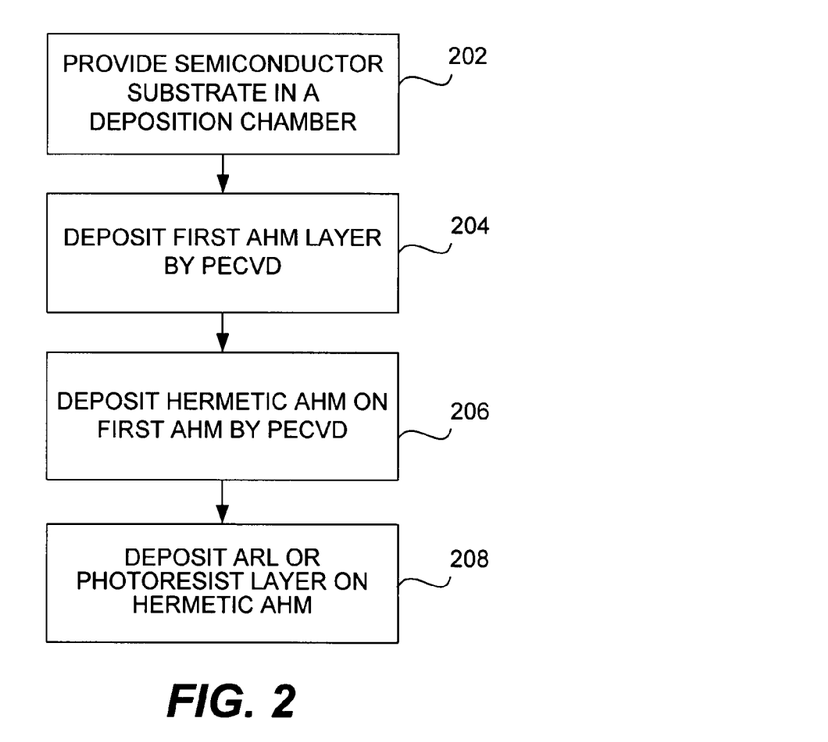

FIG. 2 shows a general process flow according to an embodiment of the present invention in which a dual layer AHM is deposited. The method begins by providing a semiconductor device substrate in a deposition chamber (202). An AHM is then deposited on the substrate by a PECVD process (204). This bottom layer of the dual layer AHM may or may not be hermetic and may be deposited using any suitable process conditions. In certain embodiments, the bottom layer is highly selective and transparent at 633 nm. Depositing a highly selective film that is transparent at 633 nm is described in commonly assigned copending U.S. patent application Ser. No. 11/449,983, which is hereby incorporated by reference for all purposes. In certain embodiments, the bottom layer of the AHM is tuned for the desired optical properties, e.g., so that the reflection from the AHM/ARL stack is minimal during lithography. The film may be tuned to achieve optimal extinction coefficients and indexes of refraction by introducing various dopants as needed into the process gas. Operation 204 continues until the desired AHM thickness is obtained, e.g., between about 1000 and 9000 angstroms.

After the bottom layer of the dual layer AHM is deposited, a hermetic cap layer—the top layer of the dual layer AHM—is then deposited (206). The methods described above with respect to FIG. 1 may be used to deposit the hermetic cap layer, for example using low precursor partial pressure and/or high LF power. According to various embodiments, hermetic cap layer thickness range from about 50-500 Angstroms thick. In certain embodiments, the hermetic cap layer is relatively thin, e.g., about 50-100 Angstroms.

After depositing the hermetic cap layer, the next layer is deposited for the lithography process (208). As indicated in the figure, this is typically either an ARL or a photoresist layer. Integration schemes are discussed further with reference to FIG. 3 below.

Figure 3:
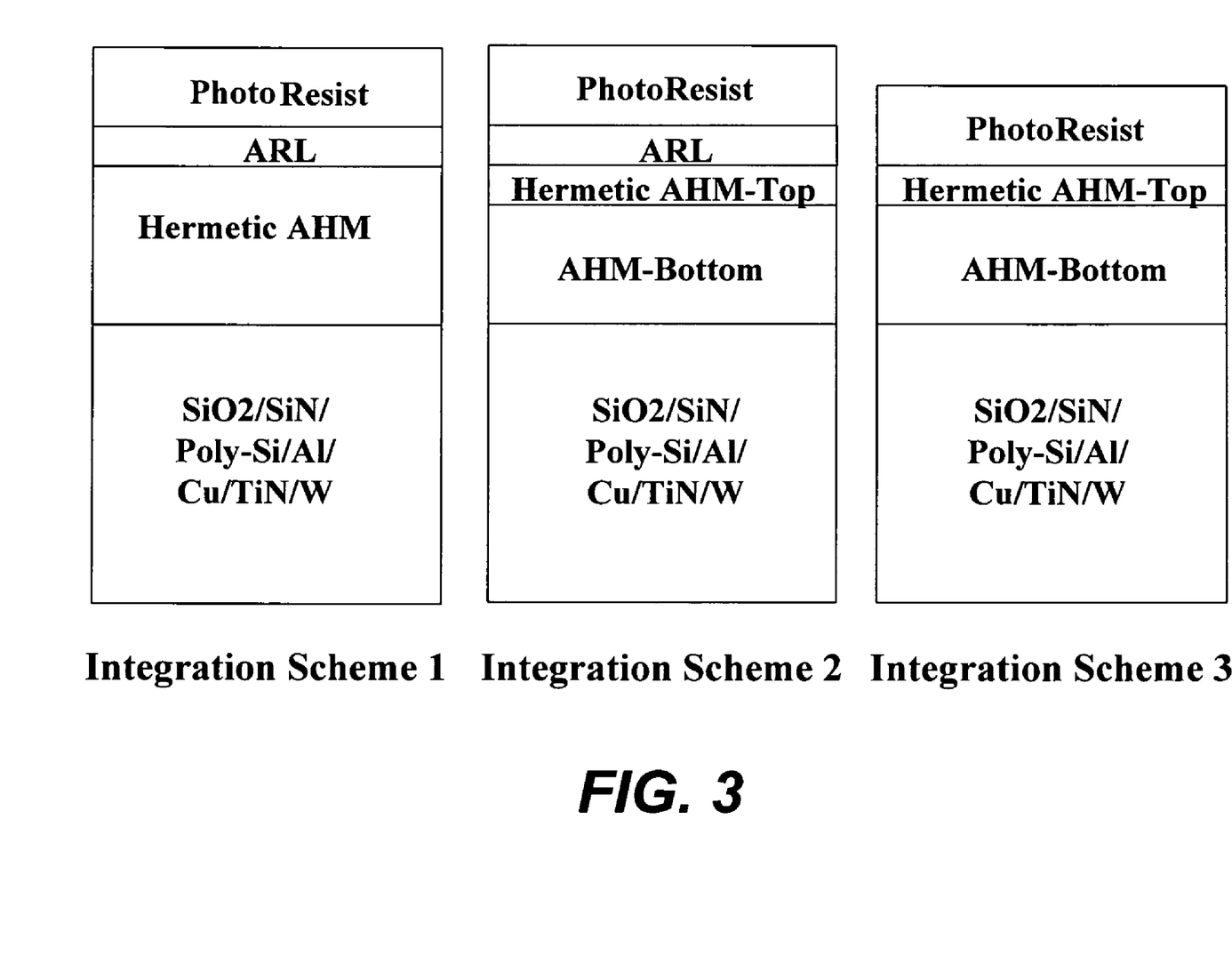
FIG. 3 depicts integration schemes according to various embodiments of the invention.

Hardmask layers are often used in applications where photoresist may not be thick enough to mask the underlying layer, e.g., narrow and/or deep contact etch applications, FIG. 3 shows three possible integration schemes for an substrate/AHM/ARL/photoresist.

Integration Scheme 1 is a representation of an AHM stack according to one embodiment. A hermetic AHM is deposited on a substrate to be patterned. Appropriate substrates include conductors, semiconductors and dielectric substrates. Specific examples include silicon dioxide, silicon nitride, poly-silicon, metals and metal nitrides, e.g., aluminum, copper, titanium, titanium nitride, tungsten and tungsten nitride. An anti-reflective layer (ARL) overlies the AHM, and a layer of photoresist overlies the ARL. The ARL reduces interference effects caused by the underlying substrate during the patterning process.

In an example of a processing scheme, the photoresist is first patterned and developed and the ARL is opened by a dry etch process. Another etch process, e.g., an oxygen-based dry etch, is then performed to open the AHM. The substrate layer (e.g., the $SiO_2$ or SiN or Poly-Si, etc.) is etched to create the desired pattern, e.g., using a dry etch. The remaining AHM is removed by ashing and other residue may be removed in subsequent cleaning operations using a wet rinse or other cleaning techniques. The result in the desired patterned substrate.

Returning to FIG. 3, Integration Scheme 2 shows an AHM/ARL/photoresist stack using a dual layer AHM. In this scheme, a bottom ARM is deposited on the layer to be patterned, and is capped by a hermetic AHM. As discussed above in reference to FIG. 2, the capping layer is typically thinner than the bottom AHM. For example, the capping layer may range from about 50-1000 angstroms, or in particular embodiments, from about 50-200 angstroms.

Integration Scheme 3 shows another possible AHM stack. In this scheme, a bottom AHM layer is deposited on the layer to be patterned and capped with a hermetic AHM (as in Scheme 2). Photoresist is deposited directly on the hermetic AHM. In certain embodiments, the AHM functions as its own ARL. In certain embodiments, silicon or other dopants may be used to increase anti-reflective properties. By adding silicon or other dopants the refractive index & extinction coefficient at the lithography wavelength (e.g., 193 nm) of the AHM can be changed significantly to reduce reflectivity and thereby achieving optimal pattern transfer. An additional ARL may be warranted if the optical properties of the AHM at 193 nm wavelength cannot be changed to reduce reflectivity.

Figure 4:
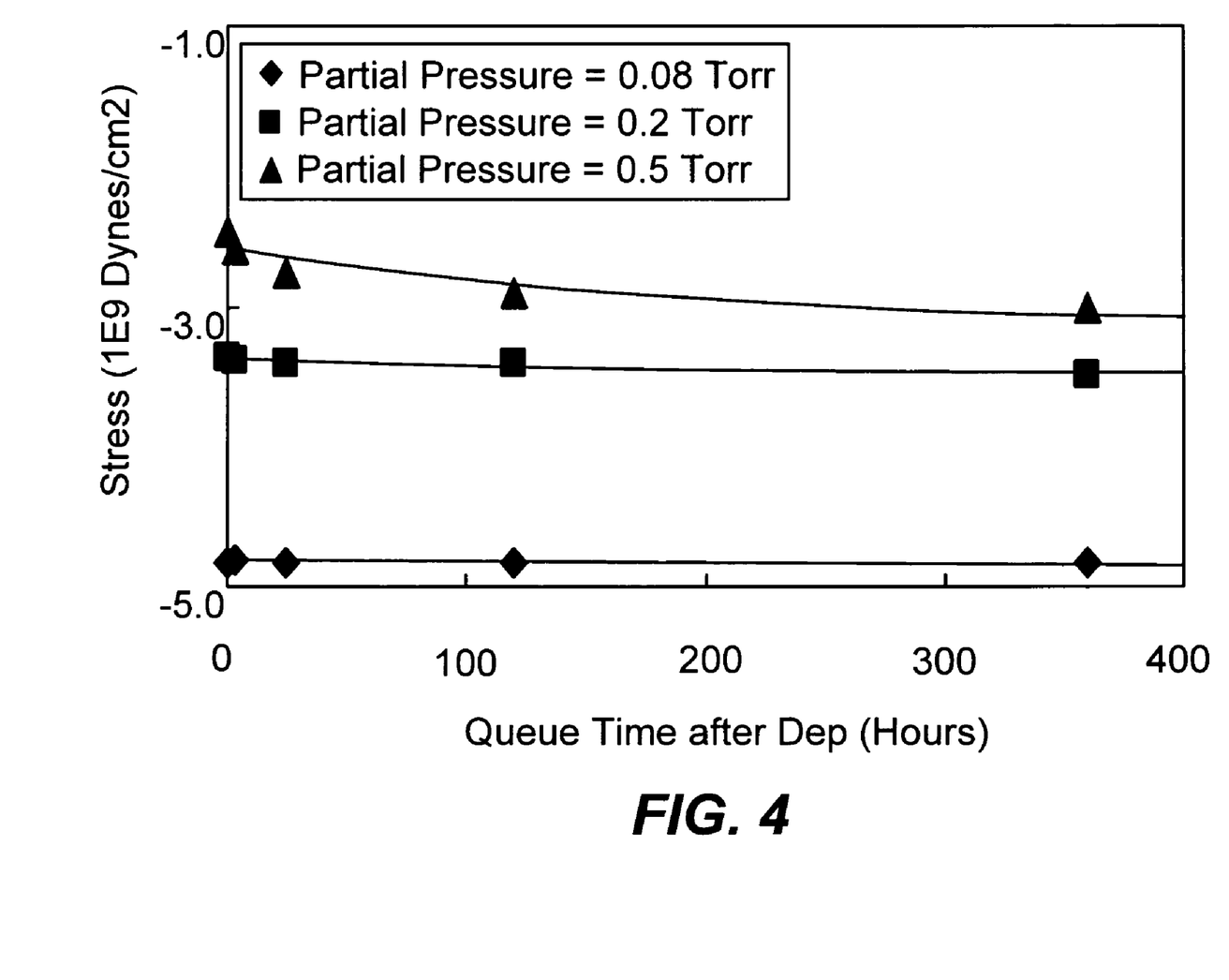
FIG. 4 is graph depicting hermeticity of AHMs as function of hydrocarbon precursor partial pressure. Hermeticity here is measured by the stress shift of the film on Si wafer after atmospheric exposure.

As indicated above, the methods of the invention involve using high LF/HF ratios and/or low precursor partial pressures to deposit hermetic films. The energy of the ions impinging on the wafer is proportional to the ratio of LF power to HF power, and inversely proportional to pressure. It is believed that the higher ion energies densify the film thereby increasing the hermeticity. FIG. 4 shows the effect of partial pressure on hermeticity of AHMs, as measured by the stress shift of the films after exposure to air. Moisture absorbed by films results in a tensile stress shift-hermetic films prevent moisture penetration and show lower stress shifts. AHMs were deposited at 0.08 torr, 0.2 torr and 0.5 torr and exposed to ambient conditions. Stress was measured at various times up to 400 hours. Results are shown in FIG. 4. Film deposited at 0.08 torr showed no stress shift even after 400 hours of exposure or queue time, as is observed from the flat stress curve. Stress shift increases as partial pressure increases.

Figure 5:
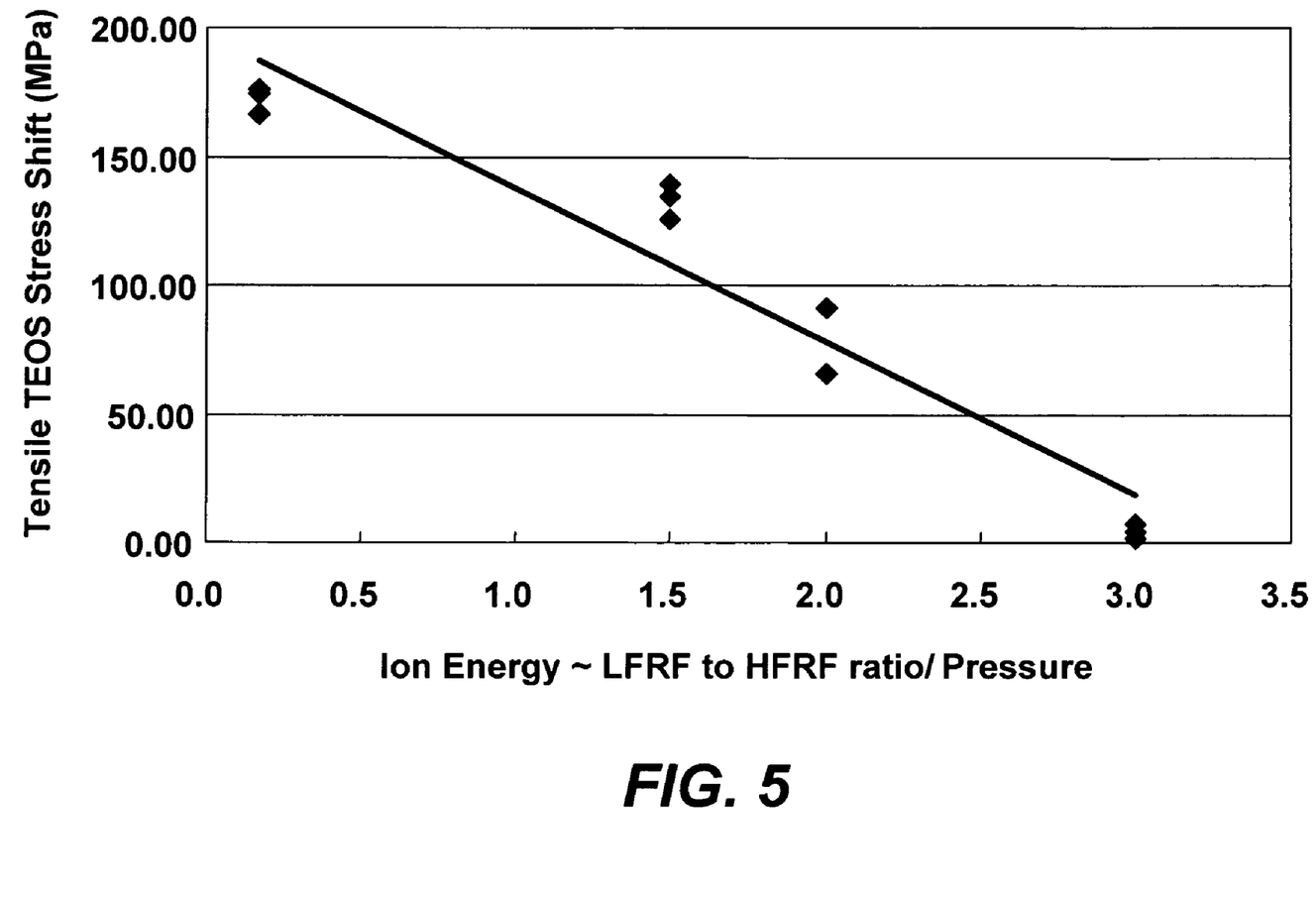
FIG. 5 is a graph depicting hermeticity of AHMs as a function of ion energy. Hermeticity is measured by the stress shift of underlying tensile TEOS films after a 24 hour pressure cooker test.

FIG. 5 shows the effect on ion energies on hermeticity of AHMs, as measured by the tensile stress shift of an underlying TEOS films after exposure to air. Ion energy is inversely proportional to total pressure (the x-axis shows inverse total pressure in units of 1/torr). Both the LF/HF ratio and total pressure were varied; LF/HF ratio from 1.33:1-3:1 and total pressure from 1 torr-8 torr. As ion energy is increased, the tensile stress shift decreases and the hermeticity increases. Ion energy is proportional to LF/HF frequency ratio, and inversely proportional to the partial pressure of the precursor.

EXAMPLES

The following example is provided to further illustrate aspects and advantages of the present invention. These examples are provided to exemplify and more clearly illustrate aspects of the present invention and are in no way intended to be limiting.

Example 1

AHMs of varying thicknesses were deposited on 10 kA tensile-TEOS wafers using process conditions indicated below. Stress shift after 3 days exposure to atmosphere was measured. Results are as below:

| Thickness (Angstroms) | $C_2H_2$ Partial Pressure (torr) | Temperature (C.) | LF/HF Ratio | Tensile TEOS stress shift (MPa) |
|---|---|---|---|---|
| 750 | 0.1 | 250 | 3/1 | 8 |
| 750 | 0.2 | 250 | 3/1 | 1 |
| 150 | 0.2 | 250 | 3/1 | 4 |
| 75 | 0.2 | 250 | 3/1 | 7 |
| 750 | 0.3 | 250 | 3/1 | 66 |
| 750 | 0.6 | 250 | 3/1 | 125 |
| 750 | 2.5 | 400 | 1.33/1 | 166 |
| Tensile TEOS without AHM | | | | 150 |

Films deposited at partial pressures of 0.2 torr and lower showed stress shifts of less than 10 MPa. As can be seen from the table, a very thin AHM (e.g., 75 Angstroms or less) may be used to prevent moisture from the underlying tensile TEOS film. Such thin films may be used in combination with a thick AHM film having tunable optical properties as described above.

Example 2

Film Characterization

Figure 6A:
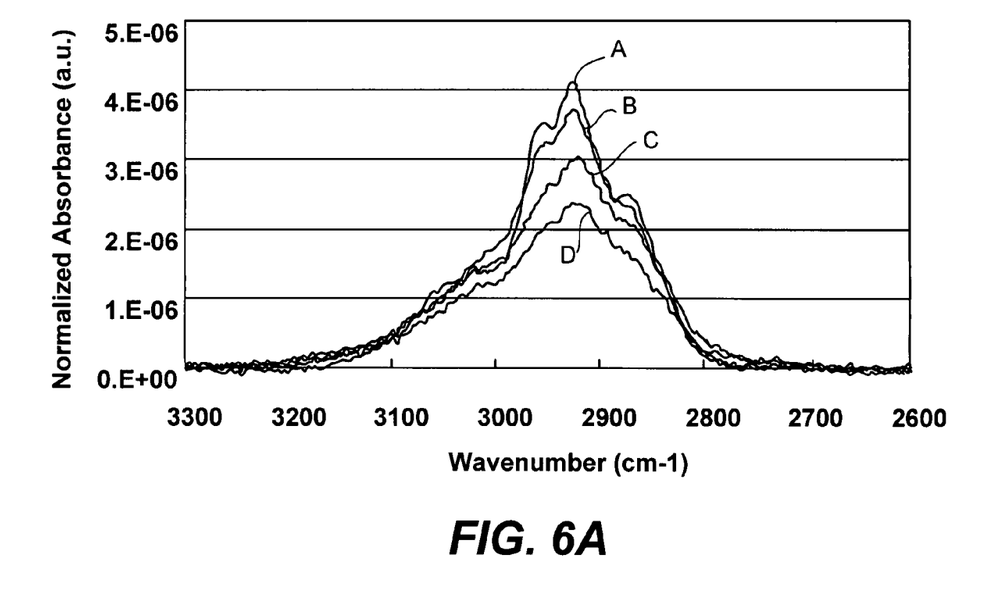
Figure 6B:
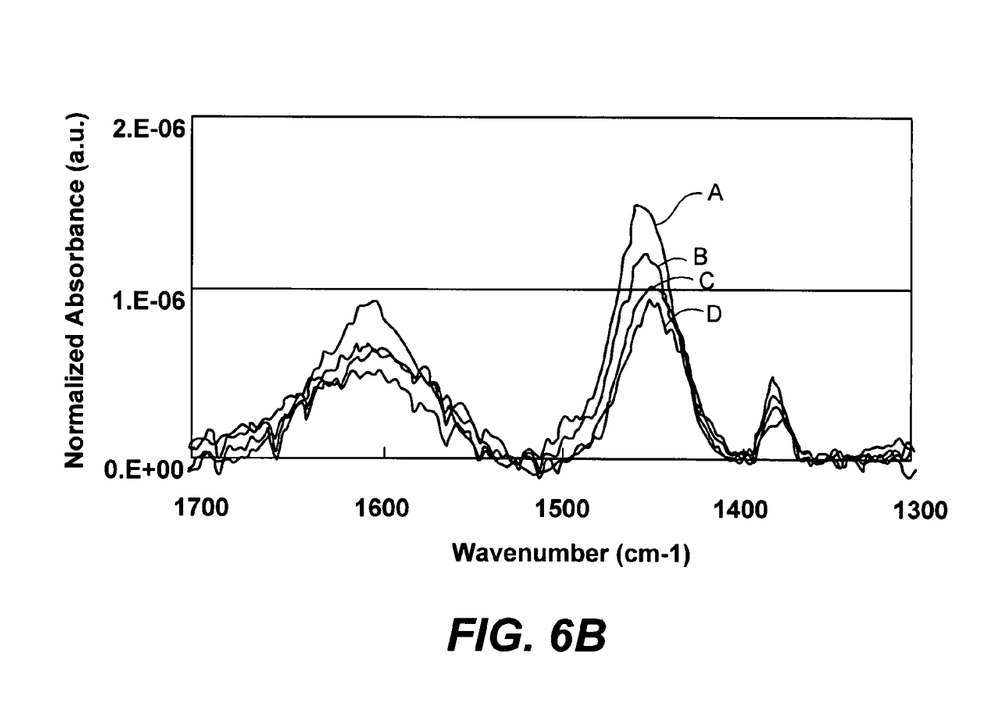

FIGS. 6A and 6B are FTIR spectra showing $CH_x$ and C=C peaks of AHMs A, B, C and D, deposited using the following conditions:

| AHM deposition condition | $C_2H_2$ Partial Pressure (torr) | Temperature (C.) | LF/HF Ratio |
|---|---|---|---|
| A | 2.5 | 400 | 1.33/1 |
| B | 0.6 | 250 | 3/1 |
| C | 0.3 | 250 | 3/1 |
| D | 0.2 | 250 | 3/1 |

Hermetic films are densely packed, which reduces the extent of stretching and bending of $CH_x$ bonds. FIG. 6A shows the $CH_x$ stretching vibration between 2800-3100 $cm^{-1}$ at around 2900 $cm^{-1}$ for these films. Film D has a FTIR peak of approximately half that of film A. (As can be seen from Example 1, AHMs deposited at conditions of D have very good hermeticity, while AHMs deposited at conditions of film A have poor hermeticity.) As hermetic films are SP3 rich, the C=C stretch decreases for hermetic films. FIG. 6B shows a C=C and two $CH_x$ bending peaks at around 1600, 1450 & 1350 $cm^{-1}$, respectively. As can be seen, these peaks are smaller for films with good hermeticity.

In certain embodiments, the hermetic AHMs have 1) a heavily crosslinked & tightly packed dense amorphous network with lower free volume and 2) significant fraction of saturated $CH_3$ bonds. For a non-hermetic films, the FTIR shows several $CH_x$ stretching peaks corresponding to SP3 $CH_3$ (2850 $cm^{-1}$), SP3 $CH_2$ (2920 $cm^{-1}$), SP2 $CH_2$ (2950 $cm^{-1}$) & SP2 CH (3050 $cm^{-1}$) bonds. However for hermetic films, FTIR shows a single peak at 2920 $cm^{-1}$ corresponding to significant fractions of SP3 $CH_2$ (2920 $cm^{-1}$) in the structures. These SP3 $CH_2$ bonds are desired for providing crosslinking in saturated state which is desired for hermeticity. In certain embodiments, the FTIR spectra of the hermetic AHMs have a narrow $CH_x$ stretch peak centered at around 2920 $cm^{-1}$ indicating dominance of SP3 $CH_2$ bonds in the amorphous network.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations. In another embodiments, wherein a dual layer stack is deposited, three stations are used to be deposit the underlying layer and the fourth station used to deposit the capping layer.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 7:
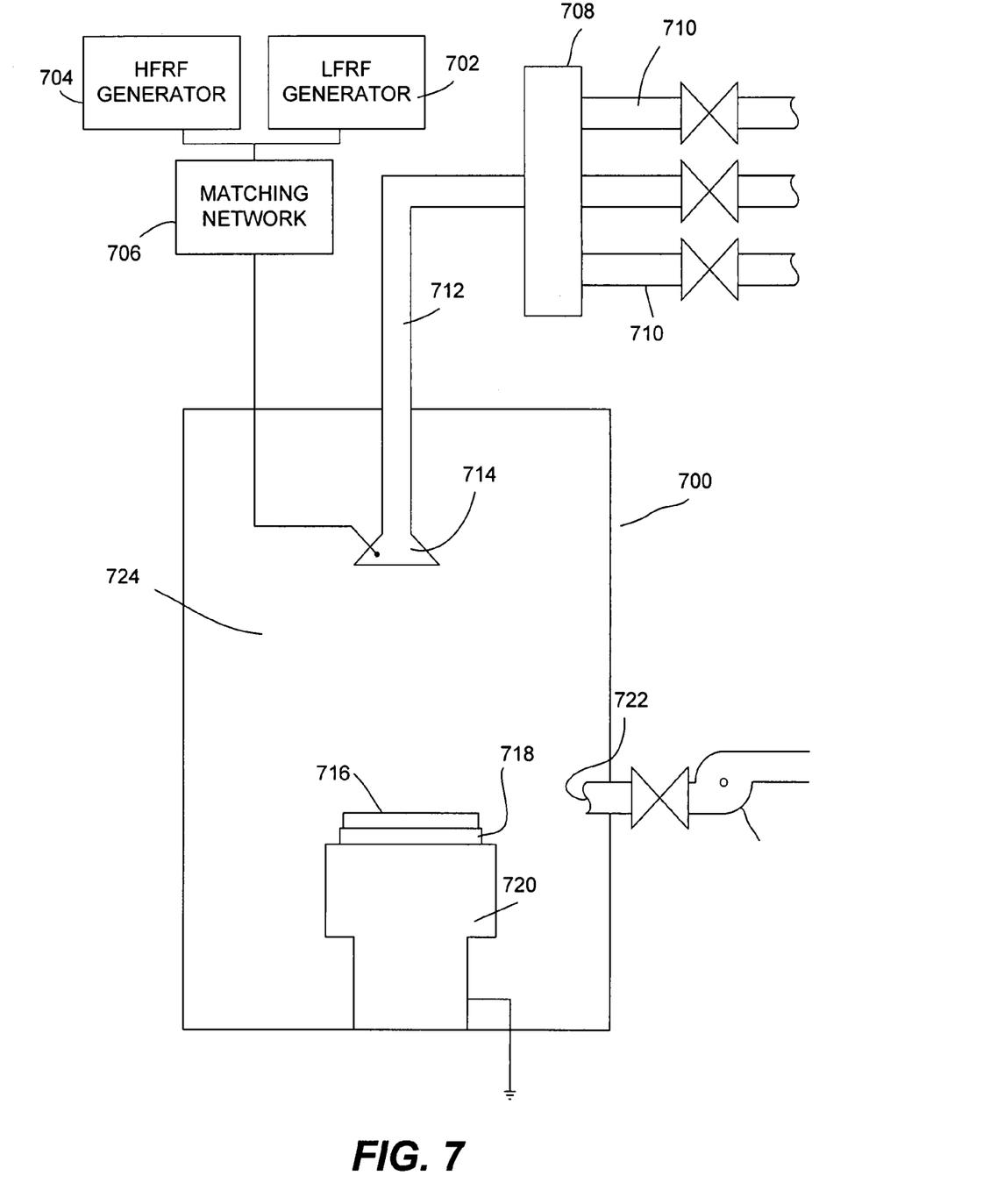
FIG. 7 is a simple block diagram depicting a PECVD reactor arranged for implementing the present invention.

FIG. 7 provides a simple block diagram depicting various reactor components arranged for implementing the present invention. As shown, a reactor 300 includes a process chamber 724, which encloses other components of the reactor and serves to contain the plasma generated by a capacitor type system including a showerhead 714 working in conjunction with a grounded heater block 720. A high-frequency RF generator 702 and a low-frequency RF generator 704 are connected to a matching network 706 and a showerhead 714. The power and frequency supplied by matching network 706 is sufficient to generate a plasma from the process gas, for example 400-700 W total energy. In a typical process, the high frequency RF component is generally between 2-60 MHz; in a preferred embodiment, the HF component is 13.56 MHz. The LF component can be from 100 kHz-2 MHz; in a preferred embodiment, the LF component is 400 kHz Within the reactor, a wafer pedestal 718 supports a substrate 716. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 712. Multiple source gas lines 710 are connected to manifold 708. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 700 via an outlet 722. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of forming a stable, hermetic ashable hardmask, comprising: providing a semiconductor device substrate in a deposition chamber; exposing the substrate to a process gas comprising a hydrocarbon precursor gas having a partial pressure between about 0.01 and 4 Torr to thereby deposit on the substrate a substantially hermetic ashable hardmask by a capacitively-coupled plasma enhanced chemical vapor deposition (PECVD) process using a dual frequency RF (LF and HF) power source, wherein the LF:HF ratio is at least about 2:1 and wherein the substantially hermetic ashable hardmask comprises a layer having a carbon content of at least about 50 atomic % and said layer is substantially hermetic.

2. The method of claim 1, wherein the LF:HF ratio is at least about 5:1.

3. The method of claim 1, wherein the LF:HF ratio is at least about 10:1.

4. The method of claim 1, wherein the partial pressure of the hydrocarbon precursor is between about 0.01 and 2 torr.

5. The method of claim 1, wherein the partial pressure of the hydrocarbon precursor is between about 0.01 and 0.2 torr.

6. The method of claim 1 wherein the AHM is deposited at a temperature at a process temperature between about 30 and 300 C.

7. The method of claim 1 wherein the process temperature is between about 100 and 250 C.

8. The method of claim 1 wherein the process gas further comprises hydrogen gas and helium gas.

9. The method according to claim 1 further comprising depositing anti-reflective and photoresist layers on the ashable hardmask.

10. The method according to claim 1 further comprising depositing a photoresist layer on the ashable hardmask without an intervening anti-reflective layer.

11. The method of claim 1 wherein the resulting hardmask has an etch selectivity of between about 12:1 and 20:1 compared to an underlying dielectric material.

12. The method of claim 1 wherein the substantially hermetic ashable hardmask is a single layer ashable hardmask.

13. The method of claim 1, wherein the partial pressure of the hydrocarbon precursor is between about 0.01 and 1 torr.

14. The method of claim 1 wherein the substantially hermetic ashable hardmask is a dual layer ashable hardmask.

15. The method of claim 14 wherein depositing a substantially hermetic ashable hardmask layer comprises depositing a first ashable hardmask on the substrate; an depositing an ashable hardmask cap layer on the first ashable hardmask; wherein ashable hardmask cap layer is substantially hermetic.

16. A method of forming a stable, hermetic ashable hardmask, comprising:

providing a semiconductor device substrate in a deposition chamber;

exposing the substrate to a process gas comprising a hydrocarbon precursor gas having a partial pressure between about 0.01 and 4 torr to thereby deposit on the substrate a substantially hermetic ashable hardmask having no more than a trace amount of silicon by a capacitively-coupled plasma enhanced chemical vapor deposition (PECVD) process using a dual frequency RF (LF and HF) power source, wherein the LF:HF ratio is at least about 2:1.

\* \* \* \* \*